United States Patent [19]

Katoh et al.

[11] Patent Number: 5,156,896
[45] Date of Patent: Oct. 20, 1992

[54] SILICON SUBSTRATE HAVING POROUS OXIDIZED SILICON LAYERS AND ITS PRODUCTION METHOD

[75] Inventors: Masakazu Katoh; Takatoshi Ishikawa, both of Furukawa, Japan

[73] Assignee: Alps Electric Co., Ltd., Tokyo, Japan

[21] Appl. No.: 556,777

[22] Filed: Jul. 24, 1990

[30] Foreign Application Priority Data

Aug. 3, 1989 [JP] Japan .................. 1-201829
May 28, 1990 [JP] Japan .................. 2-137641
Jun. 8, 1990 [JP] Japan .................. 2-150318

[51] Int. Cl.$^5$ .................. B32B 3/02; B32B 5/20
[52] U.S. Cl. .................. 428/81; 156/648; 156/653; 156/657; 156/662; 219/216; 346/76 PH; 427/255; 427/275; 427/309; 427/397.7; 428/192; 428/195; 428/318.4; 428/318.6; 428/446; 428/458; 428/469; 437/69
[58] Field of Search .......... 428/446, 458, 469, 318.4, 428/318.6, 81, 192, 195; 346/76 PH; 219/216 PH; 427/309, 255, 255.4, 397.7, 275; 156/648, 662, 657, 653; 437/69

[56] References Cited

U.S. PATENT DOCUMENTS 4,738,896 4/1988 Stevens .................. 428/315.9
4,777,583 10/1988 Minami et al. .......... 346/76 PH
4,911,783 3/1990 Voboril .................. 156/643

FOREIGN PATENT DOCUMENTS 63-257652 10/1988 Japan .

Primary Examiner—Paul J. Thibodeau
Assistant Examiner—D. S. Nakarani
Attorney, Agent, or Firm—Guy W. Shoup; David W. Heid; B. Noel Kivlin

[57] ABSTRACT

In the silicon substrate having porous oxidized silicon layers of this invention, which consists of a silicon substrate the one surface of which is dotted with porous oxidized silicon dots, the residual internal stress (compression stress) is dispersedly distributed in the porous oxidized silicon dots. Therefore, the entire silicon substrate having porous oxidized silicon dots of this invention is only minimally warped.

Adopting a method for producing the silicon substrate of this invention which consists of covering with a mask the surface of a silicon substrate except its dotting areas to be treated, subjecting the silicon substrate to anodic formation in an aqueous hydrofluoric acid solution to form porous silicon layers in the areas to be treated and not covered with the mask and then oxidizing the formed porous silicon layers enables secured production of a silicon substrate provided with a plurality of polygonal shaped dots of porous oxidized silicon.

2 Claims, 7 Drawing Sheets

SILICON SUBSTRATE HAVING POROUS OXIDIZED SILICON LAYERS AND ITS PRODUCTION METHOD

BACKGROUND OF THE INVENTION

1. Industrial Field of Application

This invention relates to a substrate for the thermal head of a heat transfer printer or a thermal printer, an optical IC, an optical switch or the like, that is to say, a silicon substrate which can be favorably used as a substrate required to have both heat insulating property and heat radiating property and its production method, and more specifically to a silicon substrate having porous oxidized silicon layers which constitute the heat storage layers of a thermal head, the heat insulating layers of an optical switch or the like and its production method.

2. Description of the Prior Art

Figure 18:
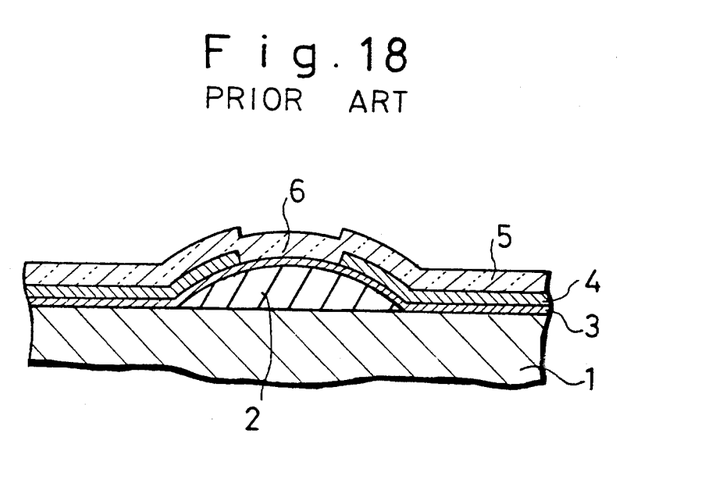

Drawing 18 indicates a conventional thermal head. This thermal head has an alumina substrate 1 and heat storage layers 2 made of glass glaze and formed on the alumina substrate 1. A heating resistor layer 3 is formed on the heat storage layer 2 and the substrate 1. A conductor layer 4 for feeding a current to the layer 3 is formed on the heating resistor layer 3. One surface of the substrate 1 is dotted with heating parts 6 each consisting of a conductor layer 4 and a resistor layer 3. A protective layer 5 for protecting the heating parts 6 from oxidation and abrasion is formed over them.

This thermal head is used while being pressed upon a recording medium such as an ink ribbon or a thermal paper (not shown in the drawing). The ink of an ink ribbon can be thermally transferred and a recording medium can be colored by heating the heating part 6 of the thermal head by feeding a current to the heating part 6.

Increasing the amount of heat stored in the heat storage layer 2 made of glass glaze by increasing its heat capacity by increasing its thickness is a means for improving the thermal efficiency of such a thermal head.

However, increasing the thickness of the heat storage layer 2 made of glass glaze results in a prolonged time required for its temperature drop after heating and deteriorated thermal response of the thermal head.

In order to improve the thermal efficiency of the thermal head while avoiding such a problem, it is recommended to provide heat storage layers having low thermal conductivity and small heat capacity.

Porous oxidized silicon (POS) is known as a material which can be used to form such heat storage layers. POS is highly heat resistant and has sufficient mechanical strength.

Figure 19:
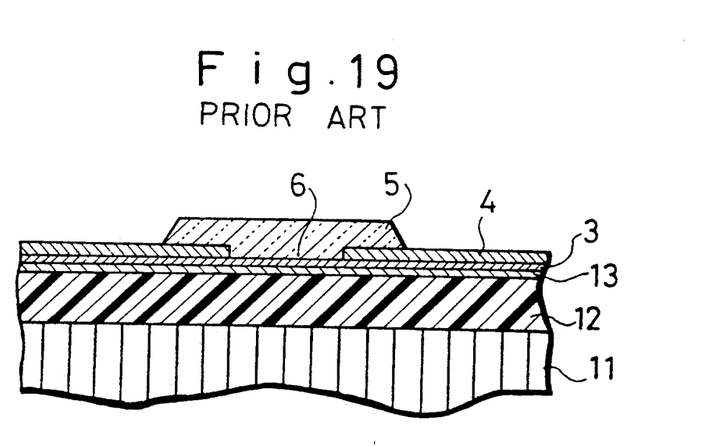

A thermal head having heat storage layers made of POS has been proposed in Japanese Patent Laid-open No. 257,652/1988. Referring to FIG. 19, this thermal head has a silicon substrate 11 and a heat storage layer 12 made of POS and formed over the entire one surface of the silicon substrate 11. On the heat storage layer 12 made of POS, a non-porous oxidized silicon layer 13, a heating resistor layer 3, a conductor layer 4 and protective layers 5 are formed in that order.

A known method for producing the silicon substrate 11 of this thermal head consists of subjecting a silicon substrate 11 to anodic formation in an electrolytic solution (aqueous hydrofluoric acid solution) composed of hydrofluoric acid, alcohol and water to form a layer consisting of porous silicon (PS) and then thermally oxidizing the PS layer.

In the above silicon substrate 11, however, since the volume of the PS layer is increased about 2.2 times during its thermal oxidation into POS, internal stress (compression stress) remains in the formed heat storage layer 12 thereby resulting in great warping of the silicon substrate 11.

In practical production of the above substrate 11, forming a POS layer (heat storage layer 12) with 25 μm thickness results in 1 mm warping per inch of the substrate 11. This warping is about 10 times that of a commercially available alumina ceramic substrate. The above silicon substrate 11 was of no practical use because of such great warping.

SUMMARY OF THE INVENTION

This invention relates to a substrate for the thermal head of a heat transfer printer or a thermal printer, an optical IC, an optical switch or the like, that is to say, a silicon substrate which can be favorably used as a substrate required to have both heat insulating property and heat radiating property and its production method, and more specifically to a silicon substrate having porous oxidized silicon layers which constitute the heat storage layers of a thermal head, the heat insulating layers of an optical switch or the like and its production method.

The object of this invention is to provide a silicon substrate having a plurality of dots of porous oxidized silicon (POS) and minimally warped and to provide its production method.

BRIEF DESCRIPTION OF THE DRAWINGS

Drawing 1 is a plane view of an example of the silicon substrate having a plurality of dots of porous oxidized silicon of this invention.

Drawing 2 is an enlarged view of part A in Drawing 1.

Drawings 3~8 are cross-sectional views for describing the processes of the production method of Example 2.

Drawing 9 is a cross-sectional view of a thermal head produced in Example 2.

Drawing 10 is a cross-sectional view indicating one process of the production method of Example 3.

Drawing 11 is a cross-sectional view of a thermal head produced in Example 3.

Drawings 12~16 are cross-sectional views indicating the processes of the production method of Example 5.

Drawing 17 is a cross-sectional view of a thermal head produced in Example 5.

Drawing 18 is a cross-sectional view of a conventional thermal head having heat storage layers made of glass glaze.

Drawing 19 is a cross-sectional view of a conventional thermal head having a heat storage layer made of porous oxidized silicon.

DETAILED DESCRIPTION OF THE INVENTION

The silicon substrate having porous oxidized silicon layers of this invention consists of a silicon substrate the one surface of which is provided with a plurality of polygonal shaped dots of porous oxidized silicon.

A suitable method for producing this silicon substrate consists of covering with a mask the surface of a silicon substrate except its dotting areas to be treated, subjecting the silicon substrate to anodic formation in an aqueous hydrofluoric acid solution to form porous silicon layers in the non-covered areas to be treated and then oxidizing the formed porous silicon layers.

A photoresist or an oxidized film is favorably used as the above mask.

A highly acid resistant one is used as a photoresist. Suitable photoresists highly acid resistant include negative resists for mesa-type etching primarily composed of cyclized-hydrocarbon-system polymers such as cyclized-butadiene-rubber-system polymers (e.g., cyclized polybutadienes) or cyclized-isoprene-rubber-system polymers (e.g., cyclized polyisoprenes).

A tantalum oxide ($Ta_2O_5$) film or a chromium oxide ($Cr_2O_3$) film is favorably used as the above oxidized film.

Suitable methods for oxidizing porous silicon into porous oxidized silicon include the thermal oxidation method of heating the substrate to 850°~1,000° C. in an atmosphere containing oxygen and the method of exposing the substrate to plasma.

Substances which can be used as masks in a method for producing the silicon substrate of this invention are not restricted to tantalum oxide, chromium oxide and photoresists and also include various passive state films as well as insulating substances not damaged by hydrofluoric acid such as silicon nitride and sialon. When a silicon nitride film or a sialon film is used as a mask, silicon nitride can be patterned or removed by dry etching. Molybdenum (Mo), tungsten (W) or a similar material can also be used to form a mask not damaged by hydrofluoric acid. When Mo or W is used for a mask, it is desirable to make the mask thick.

In the silicon substrate of this invention which has POS dots, the residual internal stress (compression stress) is dispersedly distributed in the POS dots.

EXAMPLE 1

Figure 1:
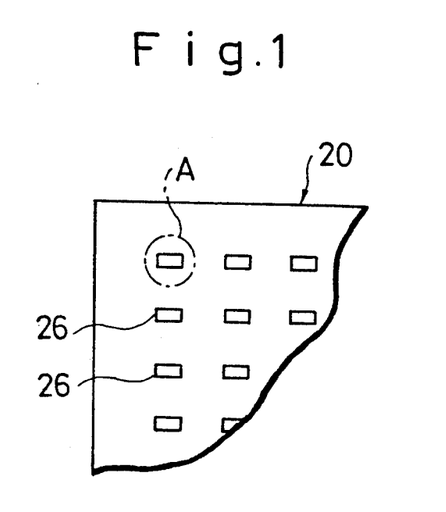

Drawing 1 indicates an example of the silicon substrate having porous oxidized silicon dots of this invention.

Figure 2:
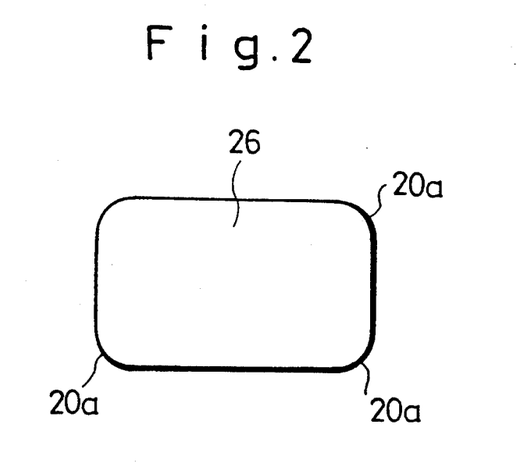

The one surface of this silicon substrate 20 is provided with a plurality of dots of Porous Oxidized Silicon (POS dots) 26. As shown in Drawing 2, the planar shape of each POS dot 26 is a rectangle having round corners 20a. The radius of the round corners 20 is adjusted to 30 μm or above. The size of each POS dot 26 is adjusted to about 1 mm width and 50 mm length. The distance between POS dots 26 is adjusted to 2 mm or above.

In this silicon substrate 20 which is provided with a plurality of POS dots 26, the residual internal stress (compression stress) is dispersedly distributed in the POS dots 26. Therefore, the entire substrate 20 is minimally warped.

Furthermore, in this silicon substrate 20 the POS dots 26 of which have round corners 20a, cracks are prevented from developing from the corners 20a of the POS dots 26.

EXAMPLE 2

A method for producing the silicon substrate 20 of the above Example 1 using a mask made of tantalum oxide and a thermal head produced from this silicon substrate 20 are described according to Drawings 3~9 in the following.

This production method is as follows.

Figure 3:
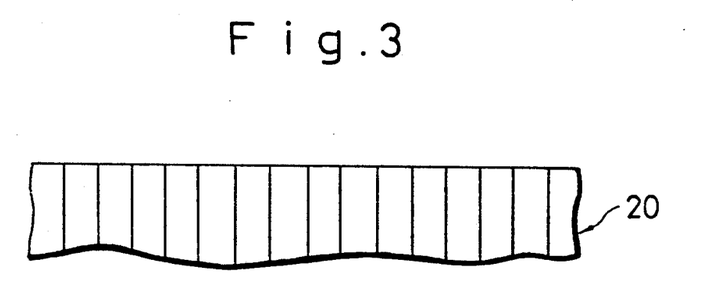

(1) Firstly, a silicon substrate 20 shown in Drawing 3 was prepared. A P-type substrate having a resistivity of 0.01 Ω. cm was used as the silicon substrate 20.

Figure 4:
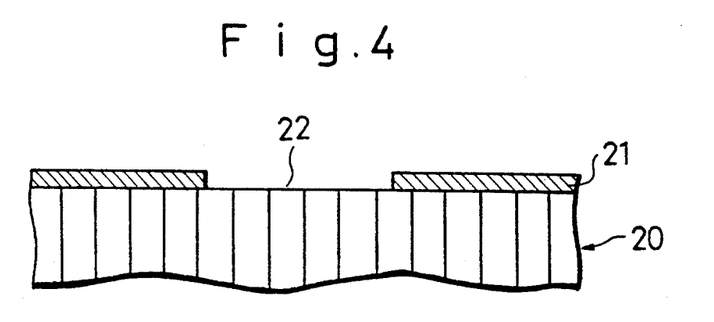

(2) Next, as shown in Drawing 4, a tantalum film 21 was formed on the silicon substrate 20 by sputtering. It was preferable that the thickness of the tantalum film 21 be about 0.1~0.5 μm. Parts of the tantalum film 21 corresponding to areas 22 in which heat storage layers were to be formed were etched by photolithography to partially expose the surface of the silicon substrate 20.

Figure 5:
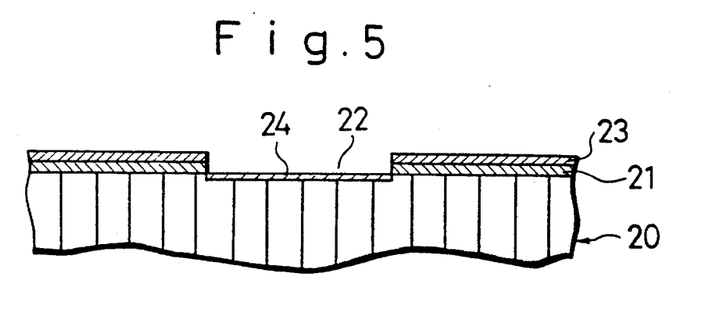

(3) Next, the above tantalum film 21 was thermally oxidized in the atmosphere at a temperature of 500°~1,000° C. to form a tantalum oxide film 23 in its surface as shown in Drawing 5. The thickness of the tantalum oxide film 23 depends upon the temperature of the oxidation treatment. During this thermal oxidation, the silicon surfaces corresponding to the above areas 22 in which heat storage layers were to be formed were also oxidized into $SiO_2$ films 24.

Figure 6:
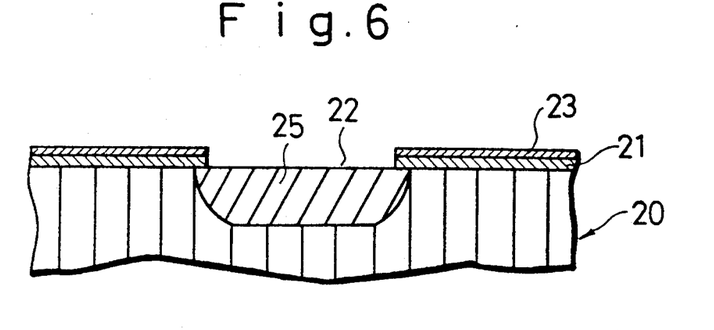

(4) Next, the above silicon substrate 20 was subjected to anodic formation using a direct current by placing the silicon substrate 20 used as an anode in an aqueous hydrofluoric acid solution of 20 wt % concentration contained in an electrolytic bath in such a manner that the substrate 20 faces a platinum plate used as a cathode. The treatment was performed at a current density of 50 $mA/cm^2$ for 20 minutes.

Since tantalum oxide is in a passive state and is not corroded by hydrofluoric acid, the above tantalum oxide film 23 formed on the silicon substrate 20 securely serves as a mask. Accordingly, porous silicon layers (PS layers) 25 having a thickness of 40 μm and a porosity of 80% were formed only in the areas 22 in which heat storage layers were to be formed and which were not coated with the tantalum oxide layer 23. The thickness of the PS layers 25 could be freely adjusted by the time of the anodic formation treatment.

Although dielectric breakdown of the tantalum oxide film 23 during the above anodic formation is apprehended, since the size of the area 22 in which a heat storage layer is to be formed is small, a current density of about 50 $mA/cm^2$ required for anodic formation of the surfaces of parts of the silicon substrate corresponding to the areas 22 can be obtained only by applying a small voltage of about 0.4 V to the surfaces. Therefore, there is no possibility that dielectric breakdown of the tantalum oxide film 23 occur during the anodic formation.

Figure 7:
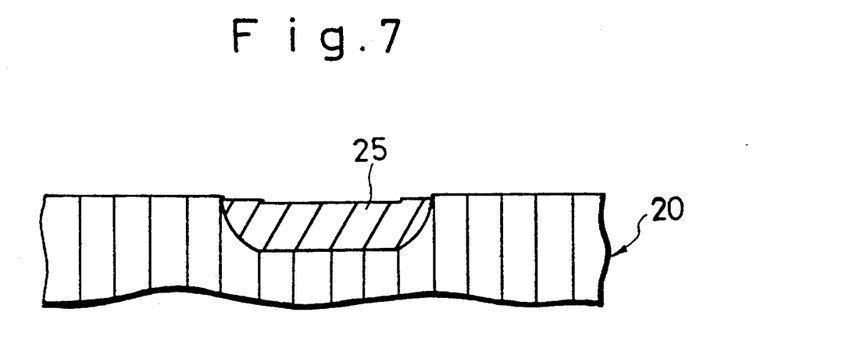

(5) Next, after sufficient washing, the tantalum film 21 and the tantalum oxide film 23 over the above silicon substrate 20 were removed by dry etching as shown in Drawing 7.

Figure 8:
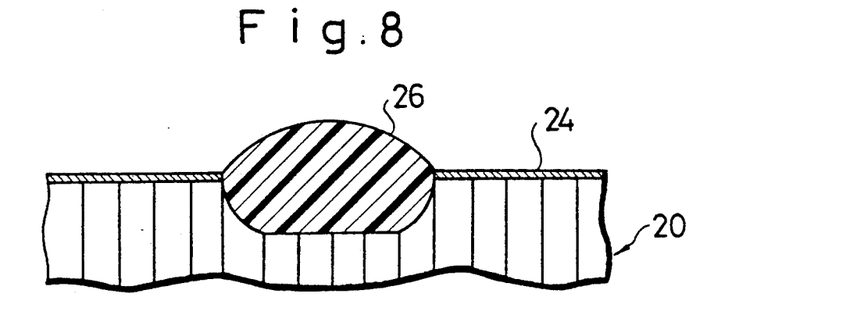

(6) Next, after sufficient washing, the above PS layers 25 were thermally oxidized at 850°~1,000° C. in a wet atmosphere of oxygen.

Oxidation of the PS layer 25, during which a volume increase occurred as porous silicon (PS) changed into porous oxidized silicon (POS), resulted in the formation a convex POS dot 26 as shown in Drawing 8. The height of the convexly protruding part of the POS dot 26 was 3~5 μm. During this oxidation treatment, the surface of the silicon substrate 20 was also oxidized and as the result a $SiO_2$ film 24 with 0.2~0.5 μm thickness was formed around the POS dots 26.

A non-porous insulating film of non-porous oxidized silicon, sialon or the like may be formed by sputtering on the thus formed silicon substrate 20 as occasion demands.

Figure 9:
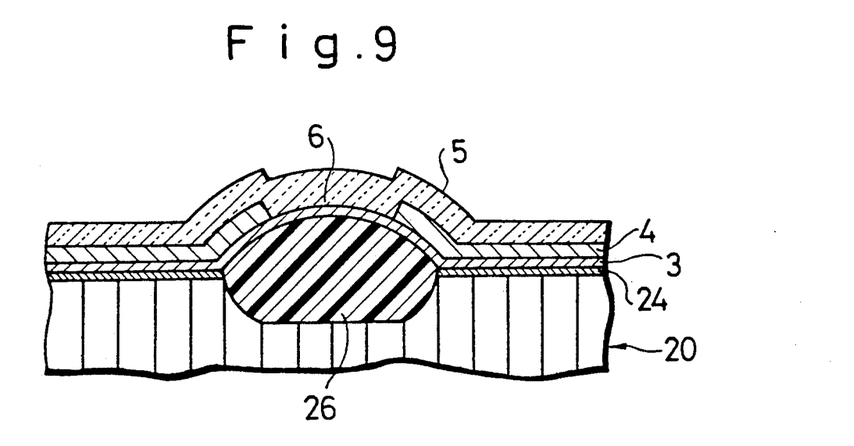

Drawing 9 indicates a thermal head in which the POS dots 26 of the silicon substrate 20 produced in the above method are used as heat storage layers. This thermal head has a heating resistor layer 3 with 0.05~0.3 μm thickness formed on the silicon substrate 20 by sputtering of $Ta_2N$, Ta-Cr-N, $Ta-SiO_2$ or the like. A conductor layer 4 with 1~2 μm thickness formed by vacuum evaporation of Al or Ni-Cr/Au is provided on the heating resistor layer 3. Parts of the conductor layer 4 corresponding to the protruding parts of the POS dots 26 have been removed by etching to form heating parts 6. The heating resistor layer 3 and the conductor layer 4 are connected to each other on both sides of the POS dots 26. A protective layer 5 with 5~7 μm thickness formed by sputtering of $SiO_2/Ta_2O_5$, sialon or the like is provided in the outermost part of this thermal head.

The production method of this example enables the silicon substrate of Example 1 to be securely produced since a tantalum oxide film used as a mask is resistant to an aqueous hydrofluoric acid solution used during anodic formation.

EXAMPLE 3

The second example of the production method of the silicon substrate is described in the following.

The first half processes of this production method are the same as the processes (1)~(4) of the above Example 2.

The production method of this example is different from that of the above Example 2 in that, immediately after the formation of PS layers 25 by anodic formation of a silicon substrate 20 as shown in the above Drawing 6, the PS layers 25 were thermally oxidized at 850°~1,000° C. into POS dots 26 without removing the tantalum film 21 and the tantalum oxide film 23 (without performing the above process (5)).

Figure 10:
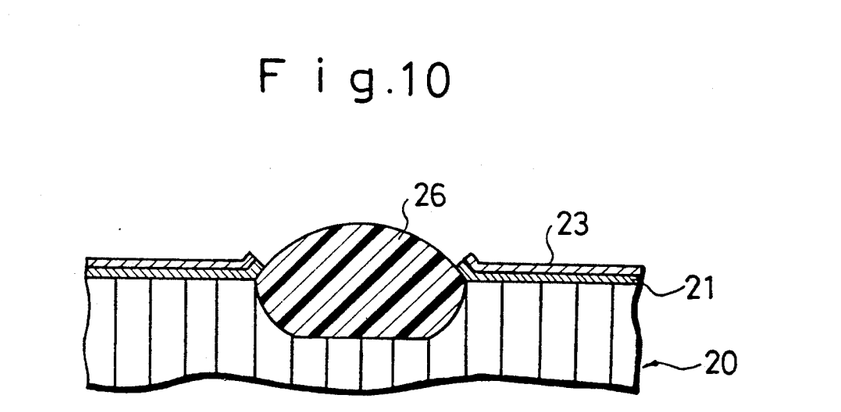

In the thus produced silicon substrate 20, as shown in Drawing 10, the peripheries of the POS dots 26 and areas in which the POS dots 26 are not formed are coated with the tantalum film 21 and the tantalum oxide film 23.

Figure 11:
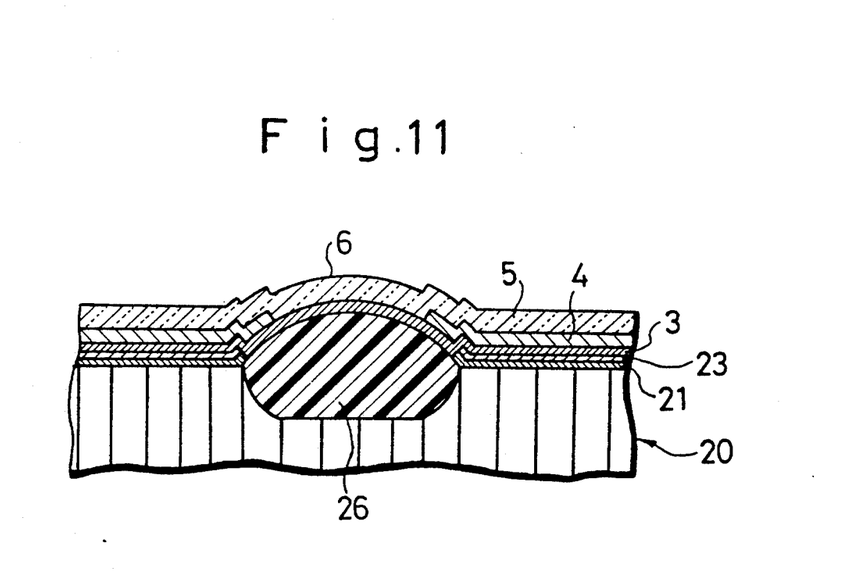

Forming a heating resistor layer 3, a conductor layer 4 and a protective layer 5 over the silicon substrate 20 by the same methods as in Example 2 results in a thermal head shown in Drawing 11.

This production method enables a silicon substrate 20 provided with a plurality of dots of porous oxidized silicon 26 to be efficiently produced.

EXAMPLE 4

The silicon substrate of this invention was produced by a method different from the production method of Example 3 only in that chromium instead of tantalum was sputtered.

Since a chromium oxide film obtained by oxidizing a chromium film formed by sputtering on a silicon substrate 20 is resistant to an aqueous hydrofluoric acid solution used for anodic formation, this production method enables a silicon substrate 20 provided with a plurality of dots of porous oxidized silicon 26 to be efficiently produced.

EXAMPLE 5

Drawings 12~17 indicate the processes of the fourth production method of the silicon substrate of this invention.

Figure 12:
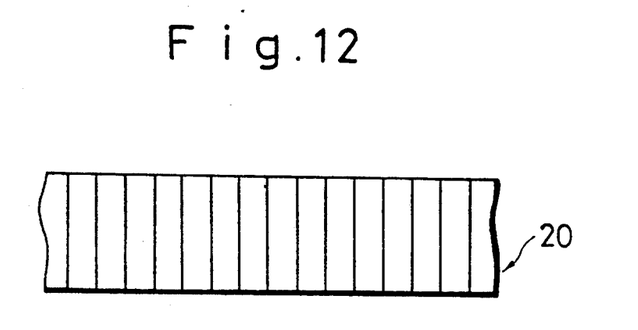

(1) In this example, firstly a silicon substrate 20 shown in Drawing 12 was prepared. A P-type substrate having a resistivity of 0.01 Ω. cm was used as the substrate 20.

Figure 13:
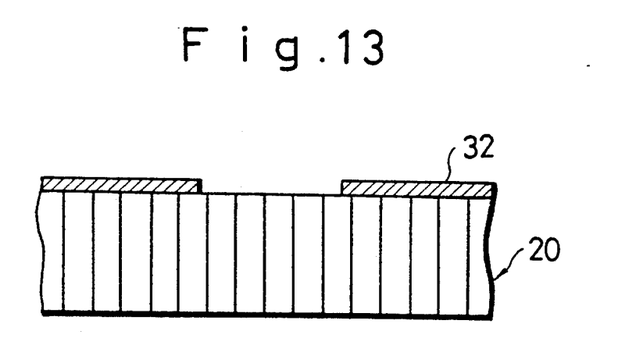

(2) Next, as shown in Drawing 13, a photoresist 32 such as a negative resist (CBR-M901: manufactured by Japan Synthetic Rubber Inc.) was applied to the silicon substrate 20 and then the formed layer was patterned by photolithography.

Figure 14:
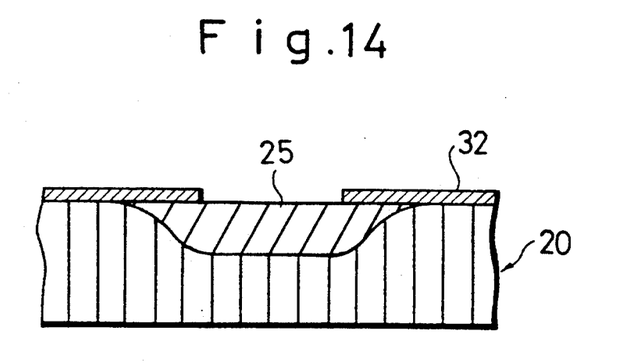

(3) After that, subjecting the silicon substrate 20 to anodic formation at a direct current density of 50 $mA/cm^2$ for 16 minutes in a 20 wt % aqueous hydrofluoric acid solution contained in an electrolytic bath using a platinum plate as a cathode and the silicon substrate 20 as an anode resulted in the formation of PS layers 25 having a porosity of 80% and a depth at the opening of the photoresist 32 of 32 μm as shown in Drawing 14. The peripheries of the thus formed PS layers 25 were coated with the photoresist 32. The depth of the coated periphery gradually decreased as it was more apart from the opening of the photoresist 32.

Figure 15:
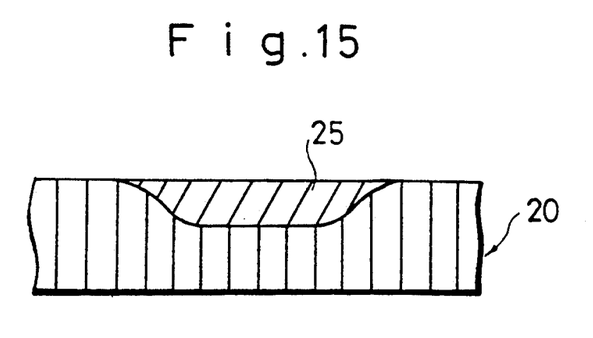

(4) Next, the photoresist 32 was removed to produce the state shown in Drawing 15. The photoresist 32 could easily be removed by a commercially available exfoliation solution or hot sulfuric acid (sulfuric acid+hydrogen peroxide solution).

Figure 16:
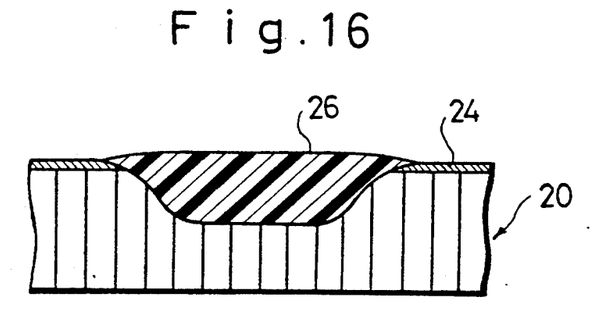

(5) Next, after sufficient washing, the PS layers 25 were thermally oxidized at 850°~1,000° C. in a wet atmosphere of oxygen. This oxidation, during which the volumes of the PS layers 25 increased, resulted in the formation of POS dots 26 protruding from the surface of the substrate 20. The thickness of the periphery of the POS dot 26 gradually decreased. The height of the POS dot 26 was 3~5 μm. As shown in Drawing 16, a $SiO_2$ layer with 0.2~0.5 μm thickness was formed on the surface of the silicon substrate 20 surrounding the POS dots 26.

Figure 17:
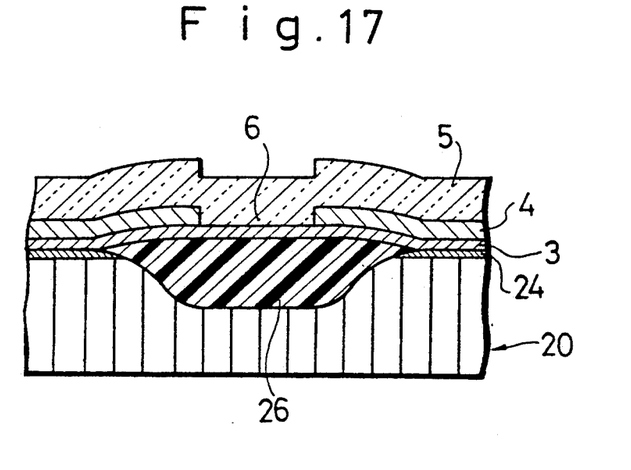

After that, forming a heating resistor layer 3, a conductor layer 4 and a protective layer over the silicon substrate 20 in that order results in a thermal head shown in Drawing 17.

According this production method, since the photoresist 32 favorably weakly adheres to the silicon substrate 20, some of the electrolytic solution permeates into the area of the substrate 20 coated with the photoresist 32 and this area undergoes weak anodic formation. As a result, the thicknesses of the peripheries of the formed PS layers 25 and the POS dots 26 obtained by oxidizing the PS layers 25 gradually decrease outwardly and therefore the concentration of the internal stress of the POS dot 26 in its periphery can be avoided. Accordingly, a silicon substrate 20 produced by this method is of practical use because it is minimally warped even in the peripheries of POS dots 26.

What is claimed is:

1. A silicon substrate having one surface which is provided with a plurality of dots of porous oxidized silicon.

2. A silicon substrate as set forth in claim 1, wherein said porous oxidized silicon dots are polygonal in shape and have corners having a curvature with a radius of 30 μm or above.

* * * * *